United States Patent [19]
Sullivan
[11] 4,345,220
[45] Aug. 17, 1982

[54] HIGH POWER MICROWAVE GENERATOR USING RELATIVISTIC ELECTRON BEAM IN WAVEGUIDE DRIFT TUBE

[75] Inventor: Donald J. Sullivan, Albuquerque, N. Mex.

[73] Assignee: The United States of America as represented by the Secretary of the Air Force, Washington, D.C.

[21] Appl. No.: 120,809

[22] Filed: Feb. 12, 1980

[51] Int. Cl.[3] .............. H03B 9/01

[52] U.S. Cl. .............. 331/79; 331/90; 315/39

[58] Field of Search .............. 331/79, 86, 90, 82; 315/39, 39.51, 39.53, 39.55, 39.61, 3.5, 5, 5.33, 5.53, 5.54

[56] References Cited

U.S. PATENT DOCUMENTS 3,700,952 10/1972 Nation .............. 315/3.5
4,122,372 10/1978 Walsh .............. 331/79 X

OTHER PUBLICATIONS

Mahaffey et al., "High-Power Microwaves from a Nonisochronic Reflecting Electron System", Physical Review Letters, vol. 39, Sep. 26, 1977, pp. 843–846.
Sullivan et al., "Simulation of Time Dependent Virtual Cathode Motion", Bulletin of American Physical Society, vol. 23, Sep. 1978, p. 764.
Sullivan, "Autoacceleration Via Virtual Cathode Oscillation", U.S. Air Force Report AFWL-DYP-TN-79-103, Mar. 9, 1979.

*Primary Examiner*—Siegfried H. Grimm
*Attorney, Agent, or Firm*—Donald J. Singer; William Stephanishen

[57] ABSTRACT

Coherent microwave radiation is generated in and transmitted through a waveguide/drift tube by means of an injected relativistic electron beam the parameters of which, in combination with the waveguide/drift tube geometry and dimensions effect a virtual cathode oscillation condition within the waveguide/drift tube. Tuning of the device is accomplished by manipulation of the relativistic electron beam parameters and/or waveguide/drift tube physical dimensions.

1 Claim, 1 Drawing Figure

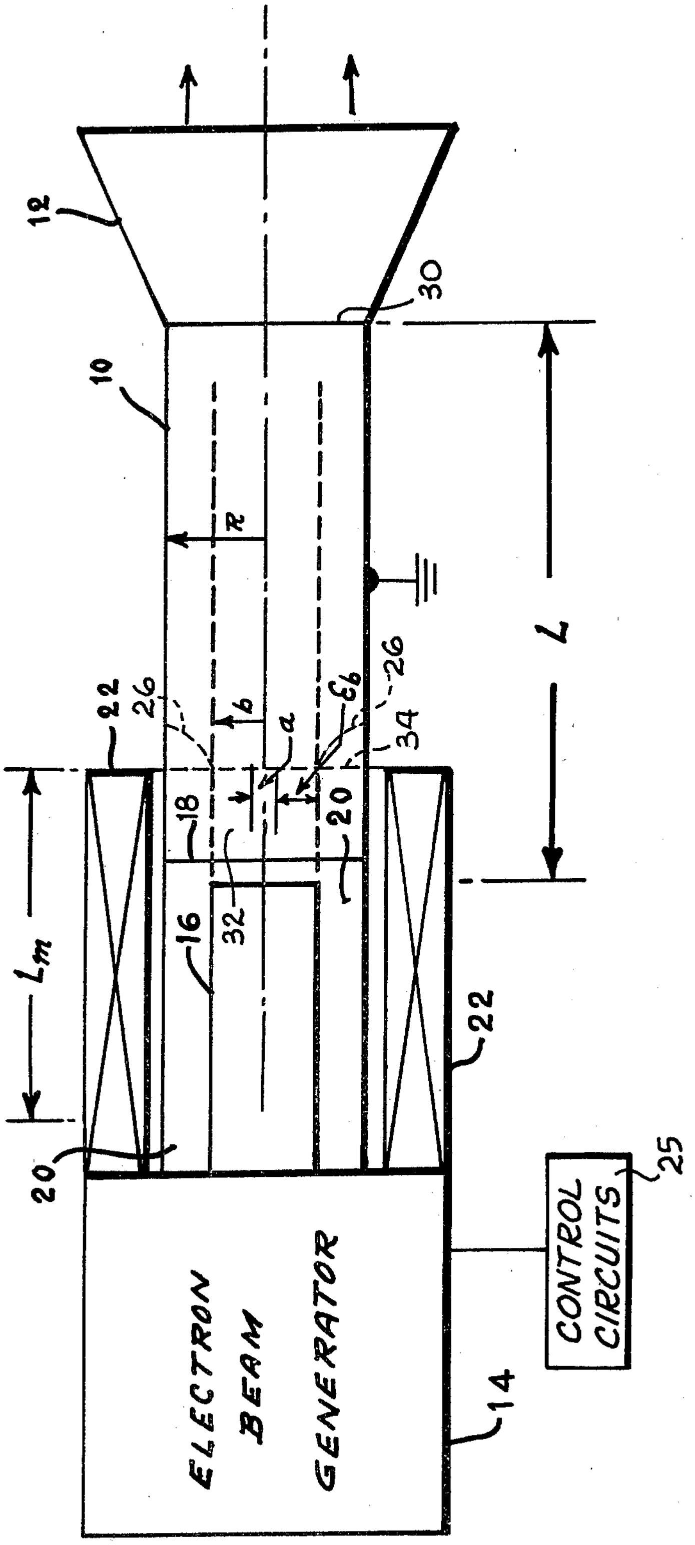
12
30
10
L
26
26
22
34
18
20
32
16
Lm
22
20
25
CONTROL CIRCUITS
ELECTRON BEAM GENERATOR
14

HIGH POWER MICROWAVE GENERATOR USING RELATIVISTIC ELECTRON BEAM IN WAVEGUIDE DRIFT TUBE

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to microwave generators, and in particular to a high power microwave generator apparatus utilizing a relativistic electron beam to generate microwave energy as a consequence of induced virtual cathode oscillation. Microwaves can be generated as direct radiation from electrical sparks across gaps by applying a high electric potential. The spark gap can also be a part of a very-high-frequency oscillating circuit which radiates electromagnetic waves. Microwaves can also be derived from the thermal radiation of warm bodies. However all these sources are unsatisfactory because of the lack of purity of the wave and the low power of the radiation. Some important microwave generators are known as klystrons, magnetrons, and traveling-wave tube oscillators. Their power outputs range from microwatts to thousands of kilowatts, depending upon the type and design of the generator and the operating frequency.

SUMMARY OF THE INVENTION

The present invention utilizes a relativistic electron beam to generate coherent electromagnetic traveling waves i.e., microwaves. The waves travel in a transverse magnetic (TM) waveguide mode. Microwave generation takes place when the injected current of the electron beam machine exceeds the space-charge limiting current of the waveguide/drift tube to which it is attached. This results in the formation of an oscillating virtual cathode. The oscillation frequency, which is in the order of the plasma frequency of the electron beam $\omega_p{}^o$, is the frequency of the generated microwaves. The wavelength is determined by the waveguide mode in which the microwaves are transmitted. Due to the combination of generation and waveguide transmission the microwaves are tuneable in power, frequency and wavelength via changes in beam kinetic energy, injected current, and density and the waveguide dimensions, provided the injected current exceeds the space-charge limiting current.

It is one object of the present invention, therefore, to provide an improved high power microwave generator apparatus.

It is another object of the invention to provide an improved high power microwave generator apparatus capable of generating high power microwaves in the order of $10^{10}$ to $10^{12}$ watts.

It is still another object of the present invention to provide an improved high power microwave generator apparatus having high efficiency in the order of approximately 30% to 40%.

It is a further object of the present invention to provide an improved high power microwave generator apparatus which is tunable in frequency, wavelength and power.

It is still a further object of the present invention to provide an improved high power microwave generator apparatus utilizing low energy relativistic electron beams (100 keV-1 MeV) that are compact and lightweight.

These and other advantages, objects and features of the invention will become more apparent after considering the following description taken in conjunction with the illustrative embodiment in the accompanying drawings.

BRIEF DESCRIPTION OF THE DRAWING

The FIGURE is a schematic illustration of the high power microwave generator apparatus in accordance with the present invention.

DESCRIPTION OF THE PREFERRED EMBODIMENT

Referring now to the FIGURE, there is shown a high power microwave generator apparatus which comprises cylindrical waveguide/drift tube 10 with a conical horn 12 and an electron beam generator 14. The parameters of the beam generated thereby are controlled by control circuit 25. The waveguide/drift tube 10 is connected to ground. The center conductor of a coax cable from within the electron beam generator 14 extends into one end of the waveguide/drift tube 10 to provide a cold field emission cathode 16. An aluminized Mylar foil 18 is positioned within the waveguide/drift tube 10 and in front of the cathode 16 to provide an anode. The region 20 that is formed by the Mylar foil anode 18, the waveguide/drift tube 10, and the electron beam generator 14, all of which enclose the cathode 16, may be evacuated to provide a vacuum diode. While the amount of vacuum applied to region 20 is not critical, a vacuum in the order of $10^{-5}$ TORR is typical. The remaining portion of the waveguide/drift tube 10 between the Mylar foil anode 18 and the conical horn 12 must also be evacuated. This is accomplished through the use of a microwave window 30 which is positioned between the waveguide/drift tube 10 and the conical horn 12 and also forms a gasket therebetween. The conical horn 12 may be fastened to the waveguide/drift tube 10 in any suitable conventional manner, such as the use of a flange with bolts or a collar. The microwave window is also a conventional means for enclosing a waveguide for various purposes such as providing a vacuum region. It should be also noted that both the aluminized Mylar foil 18 and the microwave window 30 are both transparent to electron flow and or electromagnetic radiation. An annular magnet 22 is positioned around the vacuum diode region 20 to provide a cusped magnetic field. A virtual cathode region 32 is formed in the area which is defined by the foil 18, the walls of the waveguide/drift tube that extend to the ends of the magnets 22, and the imaginary line or plane 34 that is formed between the ends of the magnets 22.

In the mathematical analysis that follows the following definitions and relationships will be useful:

The electronic space charge is given by $\phi$, where $$\phi(z,\gamma)=e\Phi(z,\gamma)/mc^2=\gamma(z,\gamma)-\gamma_o\leqq 0,$$

e is the electronic charge, $\Phi$ is the electrostatic potential$\leqq 0$, $\gamma$ is the relativistic factor, $(1-\beta^2)^{-\frac{1}{2}}$, $\gamma_o$ is the value of the $\gamma$ at injection, $\beta=v/c$, v is the electron velocity, m is the electron rest mass, and c is the speed of light. The five components in configuration-momentum space are $X1=z\omega_p{}^0/C$, $X2=\gamma\omega_p{}^0/C$, $V1=\gamma\beta_z$, $V2=\gamma\beta_r$, $V3=\gamma\beta_\theta$ where $\beta_z$, $\beta_r$, and $\beta_\theta$ are the components of $\beta$ in the z, $\gamma$, and $\theta$ directions, respectively. Also, $\omega_p{}^0=(4\pi n_b{}^0 e^2/m)^{\frac{1}{2}}$ is the electron plasma frequency arising from the beam density at injection, $n_b{}^0$.

The symbol $\nu$ is the beam current magnitude in units of $mc^3/e$, in order to determine the maximum value of $|\phi|$. The radial cross section of the relativistic electron beam shown in the FIGURE is defined as follows:

a is the inner radius, b the outer radius, R the drift tube radius, and $$\epsilon b=(b-a)/b \text{ when } 0\leqq a<R \text{ and } 0<b\leqq R.$$

Furthermore, (1) $(\gamma_o-1)mc^2$=kinetic energy of electrons at anode,
(2) $\nu_l=I_l/(mc^3/e)$, $I_l$=magnitude of limiting current,
(3) $\omega_c$=guide field cyclotron frequency and,
(4) $\omega_p$=plasma frequency at anode.

The following formulae and mathematical analysis define the space-charge limiting current of a relativistic electron beam in the strong guide-field limit.

$$\nu_l \approx \begin{cases} \dfrac{(\gamma_o^{\frac{2}{3}}-1)^{3/2}}{1-f(\epsilon)+2\ln R/b}\, G(\gamma_o,\Delta) \text{ (annular beam)} & \text{(1a)} \\ \dfrac{(\gamma_o^{\frac{2}{3}}-1)^{3/2}}{1+2\ln R/b}\, G(\gamma_o,\Delta) \text{ (solid beam)} & \text{(1b)} \end{cases}$$

Here $$G(\gamma_o,\Delta)=\frac{\gamma_o^{\frac{2}{3}}}{[(\gamma_o^{\frac{2}{3}}+\Delta)^2-\gamma_o^{\frac{2}{3}}]^{\frac{1}{2}}}-\Delta$$

with $$\Delta = \begin{cases} \dfrac{1+2\ln R/b-f(\epsilon)}{1-g(\epsilon)} \text{ (annular beam)} & \text{(2a)} \\ 1+2\ln R/b \quad \text{(solid beam)} & \text{(2b)} \end{cases}$$

Since $$f(\epsilon)=\frac{(1-\epsilon)^2}{1-\epsilon/2}\left|\frac{\ln(1-\epsilon)}{\phantom{x}}\right|$$

and $$g(\epsilon)=\frac{8(1-\epsilon)^2}{\epsilon(4-3\epsilon)}\ln\left(\frac{1-\epsilon/2}{1-\epsilon}\right),$$

it may be noted that the solid beam formulae follow from the annular beam formulae by noting that f, g→0 as $\epsilon$→1. It may also be noted that the expression multiplying G in (1b) is the well-known solid beam interpolation formula of Bogdankevich and Rukhadze, Sov. Phys.-Usp. 14, 163 (1971). The corresponding factor in (1a) generalizes this to annular beams and, in the present analysis, is the natural consequence of a lower order approximation.

There are numerous variations on the present apparatus which will produce high power microwaves in an efficient manner. For example, the electron beam machine could use a foil diode, foilless diode, reflex triode or tetrode to produce the beam. A strong axial magnetic field may or may not be utilized. The cylindrical waveguide/drift tube may be straight walled, tapered, stepped or rippled. Thus, it may be noted that many variations and combinations are possible and efficient in microwave generation to a greater or lesser extent. The only central phenomenon for the present high power microwave generator apparatus is that the injected current of an electron beam machine exceed the space-charge limiting current of the waveguide/drift tube in order that an oscillating virtual cathode forms in the virtual cathode region 32. The generation of microwaves (electromagnetic radiation) which occurs in the virtual cathode region 32 is due to the reflex action of the electrons back and forth between the real and virtual cathodes. The oscillation frequency is the frequency of the generated microwaves. Solid or annular electron beams are viable. Virtual cathode oscillation and its applicability to microwave energy generation is further explained in detail in the U.S. Air Force report AFWL-DYP-TN-79-103, dated Mar. 9, 1979 and entitled, Acceleration Via Virtual Cathode Oscillation, by D. J. Sullivan 1979 Particle Accelerator Conference Mar. 12-14, 1979, San Francisco, Calif. said publication being incorporated herein by reference.

A specific embodiment of the present invention is shown in the FIGURE. In this example, the following waveguide dimensions and relationship are utilized, a=0, b=2.1 cm, R=4.2 cm, $L_m$=10 cm and L=100 cm. The waveguide dimensions are correct provided that:

$$n_b=10^{12}\text{ cm}^{-3},\ \nu_o/\nu_l=3,\ \nu_o=3.9$$

$$\gamma_o=5 \text{ KE}=2 \text{ MeV and } I_o=65 \text{ KA}$$

The electron beam machine has a kinetic energy of $(\gamma_o-1)mc^2$ and injected current of $\nu_o>\nu_l$ and preferably $\nu_o>>\nu_l$. For an electron beam of set power but variable energy and current, the most efficient way of generating microwaves would be to maximize $\gamma_o$ of the machine provided $\nu_o\gtrsim 3\nu_l$ for the waveguide/drift tube used. The mode of the TM wave can be selected by changing the radius of the drift tube/waveguide. However, a change in radius and, therefore $\gamma_l$ also effects microwave frequency so that the two must be correlated. A cusped magnetic field from magnetic field producing means 22 is used to sweep any electrons which are transmitted beyond the virtual cathode to the waveguide/drift tube wall. No other axial magnetic field is imposed in the present example. The beam diode utilizes the grounded anode foil 18 in order to maintain a uniform ground plane across the radial cross section of the beam 26. The electron beam 26 is solid in order to minimize the value of $\nu_l$ for the given configuration. The waveguide/drift tube is also grounded. The electron beam machine has a cold emitting cathode and the diode and waveguide/drift tube are evacuated.

The device of the invention is tunable in frequency and wavelength by proper choice of relativistic electron beam parameters and waveguide/drift tube physical dimensions. The beam parameters can be controlled by conventional control circuits (shown as block 25 in the FIGURE) and the waveguide/drift tube can be mechanically reconfigured or it can be replaced by a unit of approximate size.

Although the invention has been described with reference to a particular embodiment, it will be understood to those skilled in the art that the invention is capable of a variety of alternative embodiments within the spirit and scope of the appended claims.

What is claimed is:

1. A high power microwave generator comprising
a waveguide/drift tube, the interior of said waveguide/drift tube is maintained at a vacuum, and
an anode positioned within said waveguide/drift tube,
a relativistic electron beam generator injecting a relativistic electron beam along the longitudinal axis thereof, said electron beam comprising an injected electron beam current, said anode in alignment with said electron beam generator, said anode comprises a grounded aluminum foil member traversing said waveguide/drift tube in intercepting relationship with said relativistic electron beam, said anode functioning in conjunction with said electron beam generator to form a virtual cathode, said waveguide/drift tube having geometric dimensions and said relativistic electron beam having current parameters that in combination effect the virtual cathode oscillation condition within said waveguide/drift tube to generate microwaves at a predetermined frequency, when said electron beam current exceeds the space-charge limiting current of said waveguide/drift tube, microwaves are generated, a tuning means for tuning the frequency of said microwaves, said tuning means comprises means for changing the physical dimensions of said waveguide/drift tube, and for varying the parameters of said relativistic electron beam, and, a magnetic field means generating a cusp magnetic field around said waveguide/drift tube for focusing said electron beam current at said virtual cathode.

* * * * *